United States Patent [19]

Ishikawa et al.

[11] Patent Number: 4,801,828

[45] Date of Patent: Jan. 31, 1989

[54] MULTIPHASE SOLID-STATE CONTACTOR

[75] Inventors: Masahide Ishikawa; Kazuo Sakurai; Tomio Shimizu; Junzo Tanaka, all of Kanagawa, Japan

[73] Assignee: Fuji Electric Company, Ltd., Kanagawa, Japan

[21] Appl. No.: 886,074

[22] Filed: Jul. 16, 1986

[30] Foreign Application Priority Data

Jul. 16, 1985 [JP] Japan ............................ 60-108505[U]
Jul. 17, 1985 [JP] Japan ................................ 60-157464

[51] Int. Cl.4 ............................................ H03K 17/72
[52] U.S. Cl. ..................................... 307/646; 307/632; 361/395; 361/415
[58] Field of Search ............... 307/305, 631, 638, 643, 307/646, 632, 647; 361/395, 415

[56] References Cited

U.S. PATENT DOCUMENTS

| 3,506,877 | 4/1970 | Owen | 361/395 |
|---|---|---|---|
| 3,755,695 | 8/1973 | Krick et al. | 307/599 |
| 3,816,763 | 6/1974 | Korn et al. | 307/252 T |
| 3,899,713 | 8/1975 | Barkan et al. | 307/630 |
| 3,958,172 | 5/1976 | Beck | 307/252 UA |
| 4,337,430 | 6/1982 | Flego | 307/252 T |
| 4,533,976 | 8/1985 | Suwa | 361/395 |
| 4,542,437 | 9/1985 | Ellis et al. | 361/395 |

FOREIGN PATENT DOCUMENTS 0093821  5/1985  Japan ............................ 307/252 A

*Primary Examiner*—John Zazworsky
*Attorney, Agent, or Firm*—Finnegan, Henderson, Farabow, Garrett & Dunner

[57] ABSTRACT

A multiphase solid-state contactor for controlling a principal circuit, comprising a plurality of thyristors connected in anti-parallel relation, and an electronic control circuit connected to the thyristors including a firing control circuit, an input circuit and a surge absorbing circuit. The input circuit may include a rectifier and voltage detector for compensating for variations in the operating voltage of the principal circuit. Each of the firing control circuit, the input circuit and the surge absorbing circuit may comprise separate printed circuit boards which may be mounted in stacked relation in a casing for ease of handling and repair. Auxiliary terminals are also provided for outputting an auxiliary output signal from the device.

11 Claims, 5 Drawing Sheets

MULTIPHASE SOLID-STATE CONTACTOR

BACKGROUND OF THE INVENTION

The present invention relates generally to solid state switches, and more particularly to a multiphase solid-state contactor including a power device such as a thyristor or a triac (bi-directional triode thyristor). A solid-state switch has no part that experiences electrical or mechanical wear as in the case of a mechanical switch, and is therefore capable of withstanding frequent opening and closing cycles over a prolonged service period. Because of this advantage, the solid-state switch is extensively used for opening and closing the circuits of induction motors and many other loads.

A method is known for starting and stopping a three-phase induction motor by the use of a solid-state relay having the configuration shown in FIG. 6 (this type of relay is hereinafter abbreviated as SSR). As shown in FIG. 6, the SSR (generally indicated at 1) has as its principal contact a triac 4 including two output terminals 2 and 3. The triac 4 is controlled by an electronic control circuit 5 connected to its gate. The electronic control 5 includes a firing circuit 6 and a photocoupler 8, and the firing circuit 6 includes a zero-crossing circuit 7 which allows the triac 4 to conduct in a substantially zero phase. The firing circuit 6 is connected to the phototransistor in the photocoupler 8, and the light-emitting diode in the photocoupler 8 is connected to two input terminals 10 and 11 via an input circuit 9.

The SSR may be composed of two units, SSR*a* and SSR*b*, as shown in FIG. 7. In this case the output terminal 2 of SSR*a* is connected to the R phase of a three-phase power source RST, while the output terminal 2 of SSR*b* is connected to the T phase. The ouput terminal 3 of each SSR unit and the S phase are connected to a three-phase induction motor 12 to form the principal circuit. The two input terminals 10 and 11 of each SSR unit are arranged in parallel and connected to a DC power source 14 via a switch 13. When switch 13 is closed, the motor 12 starts by conducting SSR*a* and SSR*b*. When switch 13 is opened, the motor 12 stops, since SSR*a* and SSR*b* are brought into a non-conducting state. If desired, three SSR units may be used, with each unit being inserted between each phase of the three-phase AC power source and the induction motor 12.

A solid-state relay having the configuration shown in FIGS. 6 and 7 requires that individual SSR units be used in aggregation. Connection of the principal circuit to the control circuit in such a configuration is extremely complex, and involves many separate steps or operations in the manufacturing process. In addition, at least four SSR units are required for the motor to be rotated in both forward and reverse directions, and the wiring of these four SSR units is complicated and time consuming. Compared with mechanical contactors, the SSR usually requires a DC power source for control purposes. In these cases, because of the absence of any difference between the operating voltage (closed-circuit voltage) and the return voltage (open-circuit voltage), unnecessary opening and closing operations occur in response to a variation in the control power source. The SSR, which does not have any auxiliary contacts, has the additional disadvantage that it has no self-holding capability and is unable to produce an auxiliary output that is actuated simultaneously with the opening or closing of the principal circuit.

One object, therefore, of the present invention is to provide a multi-phase solid-state contactor that is free from any of the defects of the prior art system, and which permits easy wiring operations and which can be handled with great ease.

Another object of the present invention is to provide a multiphase solid-state contactor that has the same construction and function as that of a well-known electromagnetic contactor, and which, hence, can be handled as easily as said electromagnetic contactor.

Additional objects and advantages will be obvious from the description of the invention, or may be learned by practice of the invention.

SUMMARY OF THE INVENTION

In order to achieve the foregoing objects and advantages, the multistage solid-state contactor of the present invention comprises thyristor means for opening and closing a principal circuit; and an electronic control circuit electrically connected to the thyristor means. The electronic control circuit includes firing control circuit means for activating the thyristor means, input means for controlling current to said firing control means, and surge absorbing means.

The input means preferably includes rectifier means and voltage detection means for compensating for variations in operating voltage of the principal circuit. It is also preferred that the voltage detection means include an electromagnetic relay.

The firing control circuit means, the input means, and the surge absorbing means may each comprise a separate printed circuit board, and these printed cirucuit boards may be disposed in stacked relation within an outer casing.

Preferably, auxiliary terminal means ar provided on one of the printed circuit boards for output of an auxiliary output signal from the device.

It is also preferred that the thyristor means include a plurality of reverse blocking three-terminal thyristors connected in anti-parallel relation.

BRIEF DESCRIPTION OF THE DRAWINGS

The accompanying drawings, which constitute a part of the specification, illustrate two-embodiments of the invention and together with the written description, serve to explain the principles of the invention.

Of the drawings.

DESCRIPTION OF THE PREFERRED EMBODIMENTS OF THE INVENTION

Figure 1:
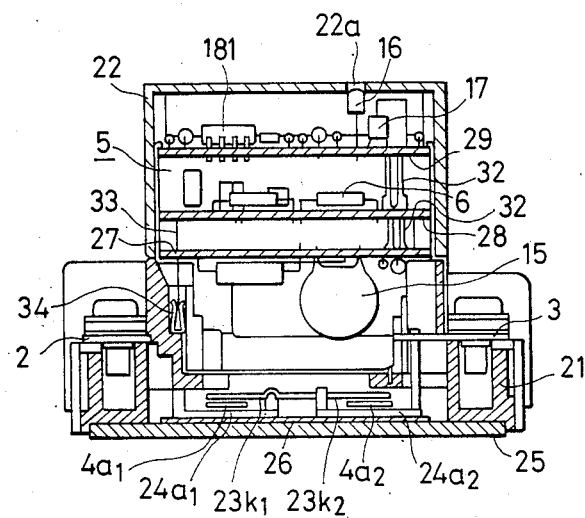
FIG. 1 is a front-elevational sectional view of a three-phase solid-state contactor according to one embodiment of the invention.

Reference will now be made in detail to the present preferred embodiments of the invention, examples of which are illustrated in the accompanying drawings.

The first embodiment of the three-phase solid-state contactor of the present invention is hereunder described in detail with reference to FIGS. 1 to 5.

The wiring of the contactor is first described with reference to FIG. 3, wherein 4a, 4b and 4c are each thyristors. The thyristors 4a, 4b and 4c are used as a power device consisting of anti-parallel connected reverse blocking three-terminal thyristors. The principal circuit of each of the thyristors 4a, 4b and 4c has two terminals 2 and 3. Between the terminals 2 and 3 is connected a surge absorbing circuit 15 composed of a surge absorber 15a, a capacitor 15b and a resistor 15c. A firing control circuit 5 is connected to the gate of each thyristor 4a, 4b and 4c. The circuit 5 is composed of a light-emitting diode 16, four photocouplers 8a, 8b, 8c and 8d, zero-crossing circuits 7, firing circuits 6, and an auxiliary output circuit 181. The zero crossing circuits 7 are connected to the phototransistors in photocouplers 8a, 8b and 8c. The auxiliary output circuit 181 is connected to the phototransistor in the photocoupler 8d and includes auxiliary terminals 19 and 20. The firing control circuit 5, wherein the light-emitting diode 16 is connected in series with each of the photodiodes in the photocouplers 8a to 8d, is connected to a rectifier circuit 17 having a voltage detector circuit 17a. Numerals 10 and 11 signify terminals for providing connection to manipulation circuit.

Figure 3:
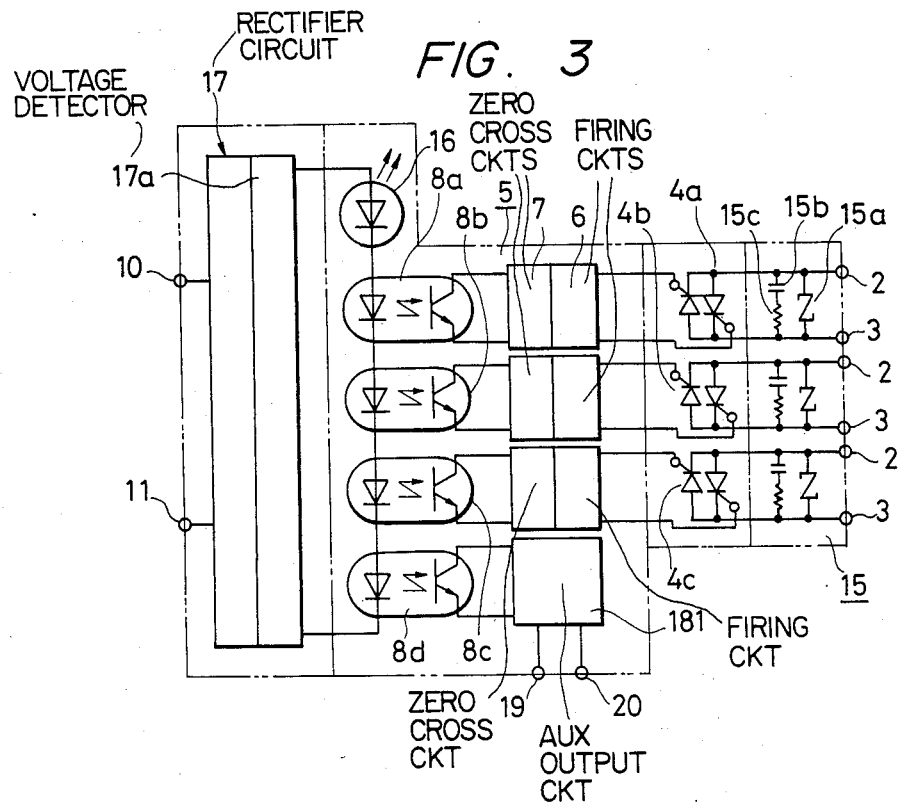
FIG. 3 is a wiring diagram of the contactor shown in FIGS. 1 and 2.
Figure 4:
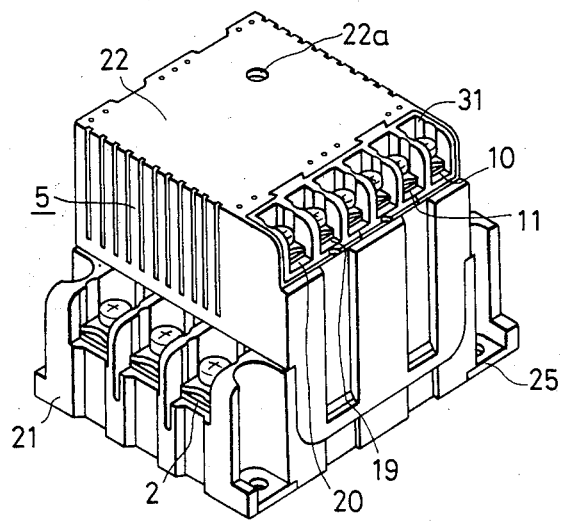
FIG. 4 is a perspective view showing the exterior of the contactor.

The power device in the three-phase solid-state contactor having the circuit configuration shown in FIG. 3 preferably is enclosed with a casing 21 as shown in FIG. 1. It is also preferred that the firing control circuit 5, surge absorbing circuit 15 and rectifier circuit 17 each be mounted on separate printed-circuit boards which are provided with a cover 22. In the illustrated embodiment of FIG. 1, both the casing 21 and the cover 22 have the same outer dimensions as those of a conventional electromagnetic contactor. The casing 21 accommodates the three thyristors, 4a, 4b and 4c, which correspond to the three phases of the principal circuit. In FIG. 1, only the thyristor 4a is shown in the form of two anti-parallel connected thyristor devices 4a1 and 4a2. The thyristor device 4a1 (or 4a2) is sandwiched between a cathode electrode 23k1 and (23k2) and an anode electrode 24a1 (24a2) and is fixed on heat dissipating copper base 25 via ceramic plate 26. Terminals 2 of the principal circuit on the power source side are pressed along one side of the casing 21, and terminals 3 of the principal circuit on the load side are pressed on the side which is opposite to the first side of the casing 21. The anode electrodes 24a1 are connected to the terminals 2, and the anode electrodes 24a2 are connected to the terminals 3. The bottom of the casing 21 accommodating the thyristors 4a, 4b and 4c is filled with an epoxy resin in order to provide the individual thyristor devices with increased resistance to the environment and to provide an enhanced insulation between each thyristor device and adjacent conductors.

Figure 2:
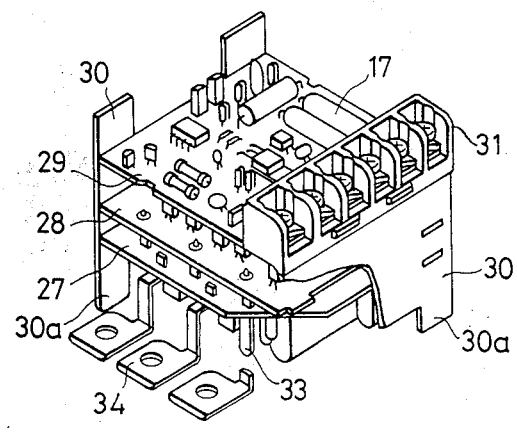
FIG. 2 is a perspective view of the electronic control circuit portion of the contactor of the same embodiment.

Above the thyristors 4a, 4b and 4c is preferably disposed a stack of three spaced printed circuit boards 27, 28 and 29 (hereinafter PCBs). As shown in FIG. 2, the PCBs 27 to 29 are supported on two side plates 30. Each side plate 30 has a leg portion 30a which is inserted into a corresponding hole in the casing 21 to provide coupling between the side plates 30 and the casing 21. The surge absorbing circuit 15 shown in FIG. 3 is mounted on the PCB 27 to form a surge absorbing module. The zero-crossing circuit 7 in the firing control circuit 5 and the firing circuit 6 are mounted on the PCB 28 to form a firing module. The rectifier circuit 17 including photocouplers 8a and 8d and voltage detector circuit 17a, and the auxiliary output circuit 181, are mounted on the PCB 29 to form an input module. One side of the topmost PCB 29 is provided with terminal blocks 31, including input terminals 10 and 11 and auxiliary terminals 19 and 20.

The PCBs 27 to 29 are formed as an electronic control circuit portion in association with the power circuit portion composed of the thyristors 4a, 4b and 4c. The three PCBs 27 to 29 are interconnected electrically by connection members 32. The firing circuit 6 on the PCB 28 is connected to the gate electrode of each thyristor on the bottom of the casing by a corresponding connection member 33 and a contactor member 34. The contactor member 34 is supported on the casing 21 and has a contactor portion at one end into which the connection member 33 may be inserted. The other end of the contactor member 34 includes a portion around which a lead wire to the gate electrode may be wound. Therefore, by coupling the contactor member 34 to the connection member 33, the power circuit portion, composed of thyristors, is electrically connected to the electronic control circuit portion.

The photodiode 16, connected in series to each of the photocouplers 8a to 8d shown in FIG. 3, is mounted on the topmost PCB 29. Thus, the photodiode 16 can be visually inspected through an inspection window 22a formed in the cover 22. This arrangement permits the operation of the contactor to be visually checked by observing the blinking of the light through the window 22a. The general view of a three-phase solid-state contactor wherein the associated circuit components are enclosed in a single casing as described above, is shown in FIG. 4.

Figure 5:
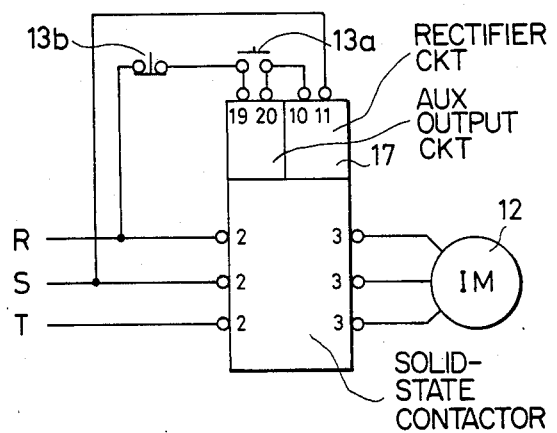
FIG. 5 is a circuit diagram illustrating the operation of a three-phase induction motor with the contactor.
Figure 6:
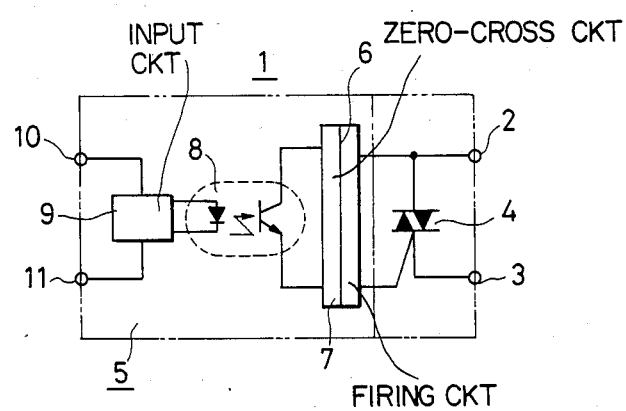
FIG. 6 is a wiring diagram of a prior art solid-state relay.
Figure 7:
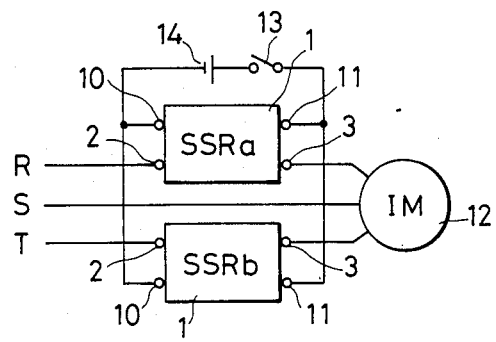
FIG. 7 is a circuit diagram illustrating the operation of a three-phase induction motor with the prior art of FIG. 6.

A wiring which may be used when the circuit of a three-phase induction motor is opened or closed by this three-phase solid-state contactor is shown in FIG. 5. In this configuration, a three-phase power structure RST is connected to a set of three terminals 2, and a three-phase induction motor 12 is connected to another set of terminals 3 so as to form the principal circuit. The input terminal 10 in the terminal block 31 is connected to phase R of an AC power source RS via auxiliary terminals 19 and 20. The other input 11 is connected to phase S. The numeral 13a signifies a starting switch connected between the auxiliary terminals 19 and 20, and 13b is a stopping switch connected in series to the power source RS. When the starting switch 13a is closed, the AC power source RS is supplied between the input terminals 10 and 11, and is rectified by the rectifier circuit 17 shown in FIG. 3. When the voltage detector circuit 17a detects that the voltage from the AC power source has reached a predetermined level, light-emitting diode 16 conducts to supply current to each of the photocouplers 8a, 8b, 8c and 8d. As a result, the firing circuit 6 is actuated by the conducting photocouplers 8a, 8b and 8c. This causes the thyristors 4a, 4b and 4c to conduct, thereby closing the principal circuit. Closing of the principal circuit allows the auxiliary output circuit 181 to become actuated to short the terminals 19 and 20. As a result, the induction motor 12 will continue to run even if the switch 13a is opened.

If the stopping switch 13b is opened to cut off the supply of input voltage, or if the input voltage drops below a predetermined level (i.e., 30% of the rated voltage in the embodiment under discussion), the voltage detector circuit 17a is turned off and the light-emitting diode 16 and the photocouplers 8a to 8d become inactivated. This causes the firing circuit 6 to be turned off bringing the thyristors 4a to 4c a non-conducting state, and opening the principal circuit.

Another embodiment of the present invention is hereunder described with reference to FIGS. 8 and 9. This embodiment is essentially the same as the first embodiment, except that an electromagnetic relay 18 is used in place of the voltage detector circuit 17a. The components of this embodiment which are identical to those used in the first embodiment are identified by like numerals, and detailed explanation of such identical parts is omitted.

Figure 8:
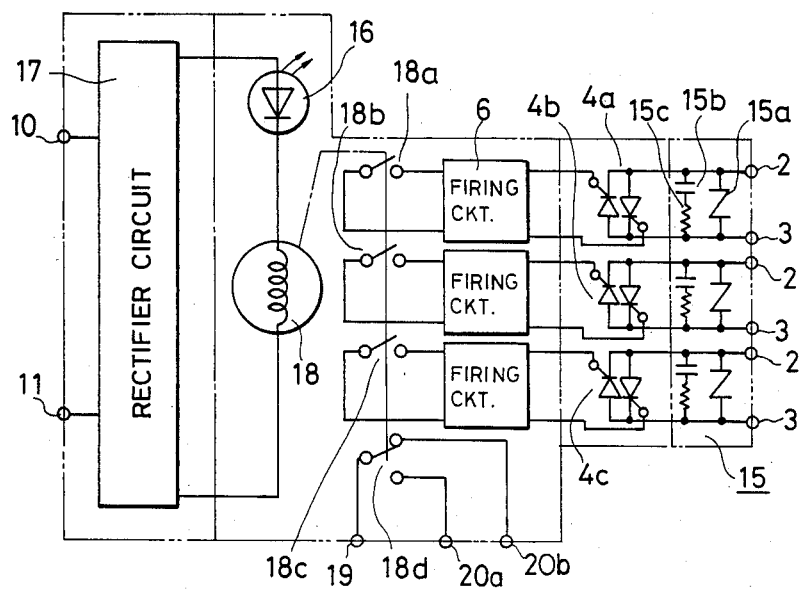
FIG. 8 is a wiring diagram of a three-phase solid-state contactor according to another embodiment of the present invention.

The wiring of the three-phase solid-state contactor according to the second embodiment is shown in FIG. 8, wherein 4a, 4b and 4c each a thyristor. As in the previous embodiment, the thyristors are used as a power device consisting of anti-parallel connected reverse blocking three-terminal thyristors. The principal circuit of each of the thyristors 4a, 4b and 4c has two terminals 2 and 3 between which is connected a surge absorbing circuit 15. A firing circuit 6 is connected to the gate of each thyristor 4a, 4b and 4c. The output of a rectifier circuit 17 connected to two input terminals 10 and 11 is connected in series to a light-emitting diode 16 and an electromagnetic relay 18. The relay 18 has normally open contacts 18a, 18b, and 18c, which are connected to their associated firing circuit 6. The relay 18 also has a changeover switch 18d in the form of two auxiliary contacts, a and b. The contacts a are composed of auxiliary terminals 19 and 20a and the contacts b are composed of auxiliary terminals 19 and 20b.

Figure 9:
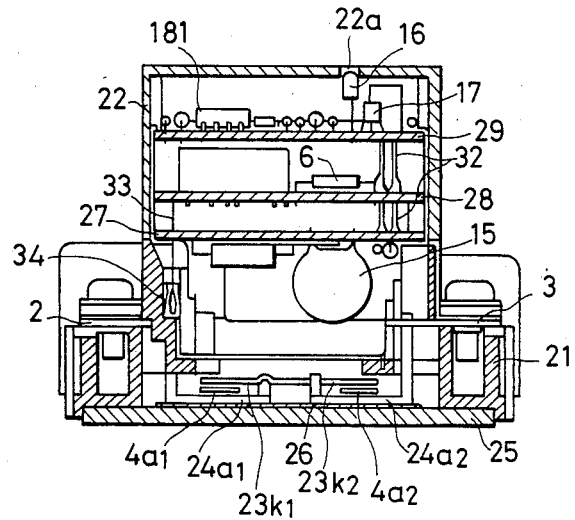
FIG. 9 is a front-elevational sectional view of the contactor of FIG. 8.

As in the first embodiment, the three-phase solid-state contactor of the second embodiment is accommodated in the casing 21 and provided with the cover 22 as shown in FIG. 9. The electromagnetic relay 18 and the firing circuit 6 are mounted on the printed circuit board 27 to form a firing module. The firing module is connected to the gate electrode of each of the thyristors 4a to 4c in the casing 21 by a connection member 33 and a contactor member 34. The surge absorbing circuit 15 is mounted on the printed circuit board 27 to form a surge absorbing module. On the printed circuit board 29 are mounted the rectifier circuit 17, the light-emitting diode 16, the auxiliary terminals 19, 20a and 20b, and input terminals 10 and 11 to form an input module. The magnetic relay 18 may be formed as a DC operated miniature relay which is capable of opening and closing operations on the order of $10^7$–$10^8$ or more, and which hence can provide satisfactory coordination with the thyristors in the principal circuit.

Figure 10:
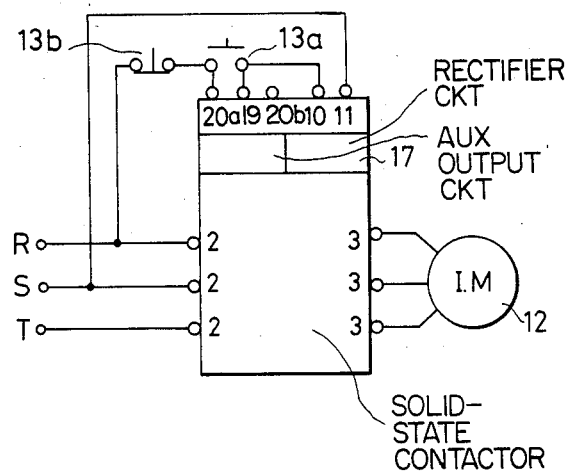
FIG. 10 is a circuit diagram illustrating the operation of a three-phase induction motor with the contactor of FIG. 8.

A wiring which may be used when the circuit of a three-phase induction motor is opened or closed by this three-phase solid-state contactor is shown in FIG. 10. In this configuration, a three-phase power source RST is connected to a set of terminals 2, and a three-phase induction motor 12 is connected to another set of terminals 3 so as to form the principal circuit. The input terminal 10 is connected to phase R of an AC power source RS via auxiliary terminals 19 and 20a, while the other input 11 is connected to phase S. The numeral 13a signifies a power supply switch connected between the auxiliary terminals 19 and 20a, and 13b is a stopping switch connected in series to the power source RS. When the power supply switch 13a is closed, the AC power source RS is supplied between the input terminals 10 and 11, rectified by the rectifier circuit 17, and supplied to the electromagnetic relay 18 via the light-emitting diode 16. If the voltage applied to the coil of the relay 18 exceeds a predetermined level (i.e., 85% of the rated voltage in the embodiment under discussion), the relay 18 will close the normally open contacts 18a to 18c, and cause the switch 18d to change its position. When the normally open contacts 18a to 18c are closed, the firing circuit 6 turns on to conduct the thyristors 4a to 4c and close the principal circuit. When the switch 18d changes its position, the auxiliary terminals 19 and 20a are shorted, and the induction motor 12 will continue to run even if the power supply switch 13a is opened.

If the stopping switch 13b is opened to cut off the supply of input voltage, or if the input voltage drops below a predetermined level (i.e., 30% of the rated voltage in the embodiment under discussion), the excitation of the coil of the electromagnetic relay 18 is weakened to such a level that the contacts 18a to 18c are opened and the firing circuit 6 is turned off. This causes the thyristors 4a to 4c become non-conducting, thereby opening the principal circuit. At the same time, the switch 18d changes its position such that the auxiliary terminals 19 and 20a are opened.

In the second embodiment shown above, a single relay with a plurality of contacts is used to provide contacts for firing and contacts for producing an auxiliary output. However, it should be understood that these two operations may be achieved by separate independent relays. The use of an electromagnetic relay has the advantage that the electrical insulation between the coil and the contacts ensures electrical isolation between the input circuit of thyristors, their power circuit portion, and the auxiliary output circuit.

As will be understood from the foregoing description, the multiphase solid-state contactor of the present invention has several advantages. For example, the power circuit portion, which serves to open or close the principal circuit and which is composed of an array of anti-parallel connected thyristors, is accommodated within a casing. The electronic control circuit portion is separated into several components by function. Each separate portion is mounted on a separate printed circuit board and these are integrated in the casing. Therefore, the solid-state contactor of the present invention can be manufactured using the casing and cover for the prior art electromagnetic contactor without introducing any change in their outer dimensions. This enables the solid-state contactor of the invention to be manufactured without substantially changing the associated parts used with the prior art electromagnetic contactor. In addition, the power circuit portion, which is responsible for the opening and closing of the principle circuit, may be assembled on a separate assembly line from the electronic control circuit portion with the two circuit portions being connected only in the final stage of assembly. This eliminates the need for keeping many inventories of solid-state contactors according to rating and specifications, and provides more efficient production management. Also, the electronic control circuit portion is divided by function into an input module, a firing module and a surge absorbing module, and these modules are mounted on separate printed circuit boards. This modular design provides the advantage that if a failure occurs in one module, only the affected printed circuit board need be replaced instead of replacing the entire part of the electronic control circuit portion.

Incorporation of a rectifier circuit into the input module allows the solid-state contactor of the present invention to be directly used in the control circuit of a three-phase induction motor, which typically employs an AC operating power source. In other words, the application of the solid-state contactor of the present invention to a three-phase induction motor is straightforward and does not require any separate DC power source or an externally connected rectifier. In addition, incorporation of a voltage detector circuit or an electromagnetic relay having the capability of voltage detection into the input module provides the operation of the solid-state contactor of the present invention with hysteresis characteristics wherein the operating voltage differs from the return voltage. Thus, the contactor can operate in a reliable manner without making any unnecessary response to the variation in the operating voltage. The built-in auxiliary terminals for auxiliary outputs also provide a self-holding capability for the solid-state contactor of the present invention, which ensures the production of signals that synchronize with the operation of the principal circuit. This provides visual display in remote control, and interlocking with other units of the solid-state contactor. A particular advantage results when two units of the solid-state contactor are used to realize bi-directional rotation of a motor. In addition, the two solid-state contactors can be easily interlocked with the aid of the auxiliary contacts provided on each contactor.

In view of the above, it is believed that the present invention provides significant advantages and represents a significant advance over the prior art. The present invention has been described by the use of examples, but it is understood that additional modifications and variations of the invention could be made to the invention without departing from the scope or spirit of the invention.

What is claimed is:

1. A multiphase solid-state contactor for controlling the application of power from a power source to a principal circuit, said contactor comprising:
   thyristor means for opening and closing the principal circuit; and
   an electronic control circuit coupled to said thyristor means, said electronic control circuit including,
      firing control circuit means for activating said thyristor means,
      input means for controlling current to said firing control circuit means, wherein said input means includes rectifier means for rectifying the voltage of the power source to produce a rectified voltage, and voltage detection means coupled to said rectifier means for detecting when the voltage of the power source has reached a predetermined voltage level and causing said rectified voltage to be applied to said firing control circuit means upon detecting at least said predetermined voltage level,
      auxiliary output circuit means operatively coupled to the power source and to said input means for selectively applying power from the power source to said input means to cause said firing control circuit means to activate and deactivate said thyristor means, and
      surge absorbing means coupled to said thyristor means for protecting said thyristor means from power surges from the power source, wherein each of said firing control circuit means, said input means and said surge absorbing means is mounted on a separate printed circuit board.

2. The contactor of claim 1, further including an outercasing, said printed circuit boards being mounted in stacked relation within said casing.

3. The contactor of claim 2, further including:
   a plurality of contactor members mounted to said casing, each of said contactor members having a contactor portion and each of said contactor members having a gate electrode portion for coupling said contactor member to said thyristor means; and
   a corresponding plurality of connection members mounted to the one of said printed circuit boards which includes said firing control circuit means, each of said connection members detachably contacting said contactor portion of one of said contactor members;
   each of said contactor members and a corresponding one of said connection members electrically coupling said firing control circuit means to said thyristor means when said contactor member and said connection member are in a contacting and non-detached relationship.

4. The contactor of claim 2, wherein:
   said firing control circuit means includes illumination means for providing illumination when said firing control circuit means is activated; and
   said outer casing includes an inspection window formed in said outer casing for inspecting said illumination means to determine the state of illumination of said illumination means.

5. A multiphase solid-state contactor for controlling the application of power from a power source to a principal circuit, said contactor comprising:
   thyristor means for opening and closing the principal circuit; and
   an electronic control circuit coupled to said thyristor means, said electronic control circuit including,
      firing control circuit means for activating said thyristor means,
      input means for controlling current to said firing control circuit means,
      auxiliary output circuit means operatively coupled to the power source and to said input means for selectively applying power from the power source to said input means to cause said firing control circuit means to activate and deactivate said thyristor means, wherein said auxiliary output circuit means includes:
         auxiliary terminal coupling means for selectively causing said auxiliary output circuit means to couple said input means to the power source;
         starting switch means coupled to said auxiliary terminal coupling means for electrically coupling said input means to the power source; and stopping switch means coupled between said auxiliary terminal coupling means and the power source for decoupling said input means from the power source; and surge absorbing means coupled to said thyristor means for protecting said thyristor means from power surqes from the power source.

6. The contactor of claim 5, wherein said input means includes:

rectifier means for rectifying the voltage of the power source to produce a rectified voltage; and voltage detection means coupled to said rectifier means for detecting when the voltage of the power source has reaced a predetermined voltage level and causing said rectified voltage to be applied to said firing control circuit means upon detecting at least said predetermined voltage level.

7. The contactor of claim 6, wherein:

said voltage detection means includes an electromagnetic relay; and said auxiliary terminal coupling means includes contact means responsive to said electromagnetic relay for electrically coupling said input means to the power source.

8. A multiphase solid-state contactor for controlling the application of power from a power source to a principal circuit, said contactor comprising:

thyristor means for opening and closing the principal circuit; and an electronic control circuit coupled to said thyristor means, said electronic control circuit including, firing control circuit means for activating said thyristor means, input means for controlling current to said firing control circuit means, wherein said input means includes rectifier means for rectifying the voltage of the power source to produce a rectified voltage, and voltage detection means coupled to said rectifier means for detecting when the voltage of the power source has reached a predetermined voltage level and causing said rectified voltage to be applied to said firing control circuit means upon detecting at least said predetermined voltage level, and auxiliary output circuit means operatively coupled to the power source and to said input means for selectively applying power from the power source to said input means to cause said firing control circuit means to activate and deactivate said thyristor means, and surge absorbing means coupled to said thyristor means for protecting said thyristor means from power surges from the power source, wherein said voltage detection means includes an electromagnetic relay.

9. The contactor of claim 8, wherein said firing control circuit means includes a predetermined number of contact means responsive to said electromagnetic relay for closing said firing control circuit means to cause said thyristor means to provide power from said power source to said principal circuit, said predetermined number of contact means corresponding to the number of phases in said power source.

10. The contactor of claim 8, wherein said auxiliary output circuit means includes contact means responsive to said electromagnetic relay for selectivey applying power from the power source to said input means to cause said firing control circuit means to activate and deactivate said thyristor means.

11. A multiphase solid-state contactor for controlling the application of power from a power source to a principal circuit, said contactor comprising:

thyristor means for opening and closing the principal circuit; and an electronic control circuit coupled to said thyristor means, said electronic control circuit including, firing control circuit means for activating said thyristor means, input means for controlling current to said firing control circuit means, wherein said input means includes rectifier means for rectifying the voltage of the power source to produce a rectified voltage, and voltage detection means coupled to said rectifier means for detecting when the voltage of the power source has reached a predetermined voltage level and causing said rectified voltage to be applied to said firing control circuit means upon detecting at least said predetermined voltage level, and auxiliary output circuit means operatively coupled to the power source and to said input means for selectively applying power from the power source to said input means to cause said firing control circuit means to activate and deactivate said thyristor means, and surge absorbing means coupled to said thyristor means for protecting said thyristor means from power surges from the power source, wherein said thyristor means includes a plurality of reverse-blocking three-terminal thyristors connected in anti-parallel relation.

* * * * *